United States Patent [19]

Zdunek

[11] 4,243,941
[45] Jan. 6, 1981

[54] DIGITAL SIGNAL RECEIVER HAVING A DUAL BANDWIDTH TRACKING LOOP

[75] Inventor: Kenneth J. Zdunek, Schaumburg, Ill.

[73] Assignee: Motorola, Inc., Schaumburg, Ill.

[21] Appl. No.: 967,183

[22] Filed: Dec. 7, 1978

[51] Int. Cl.³ .......................... H03D 3/18; H03L 7/10
[52] U.S. Cl. ...................................... 329/50; 329/104; 329/122; 331/12; 331/17; 375/81; 455/260
[58] Field of Search ................. 329/50, 122, 124, 104; 331/17, 23, 12; 325/346, 349, 419–423; 375/81; 455/260

[56] References Cited

U.S. PATENT DOCUMENTS

| | | | |
|---|---|---|---|
| 3,101,448 | 8/1963 | Costas | 329/50 |
| 3,586,776 | 6/1971 | Salava | 178/69.5 R |
| 3,768,030 | 10/1973 | Brown et al. | 331/12 |
| 3,906,445 | 9/1975 | Beckmann et al. | 340/146.1 BA |
| 3,909,735 | 9/1975 | Anderson et al. | 329/122 |
| 3,983,501 | 9/1976 | Lindstrum | 329/122 |

Primary Examiner—Siegfried H. Grimm
Attorney, Agent, or Firm—Rolland R. Hackbart; James W. Gillman

[57] ABSTRACT

A DPSK digital signal receiver is disclosed that has a dual bandwidth offset Costas loop that is switchable from an acquire bandwidth to a narrower tracking bandwidth in response to detection of a start code preceding a message signal included in the digital signal. Detection of the start signal may occur before absolute carrier lock on, which then is completed in the narrowband tracking mode. Thus, carrier acquisition is achieved much faster than that obtained by prior art circuits requiring absolute carrier lock on before switching bandwidths.

11 Claims, 1 Drawing Figure

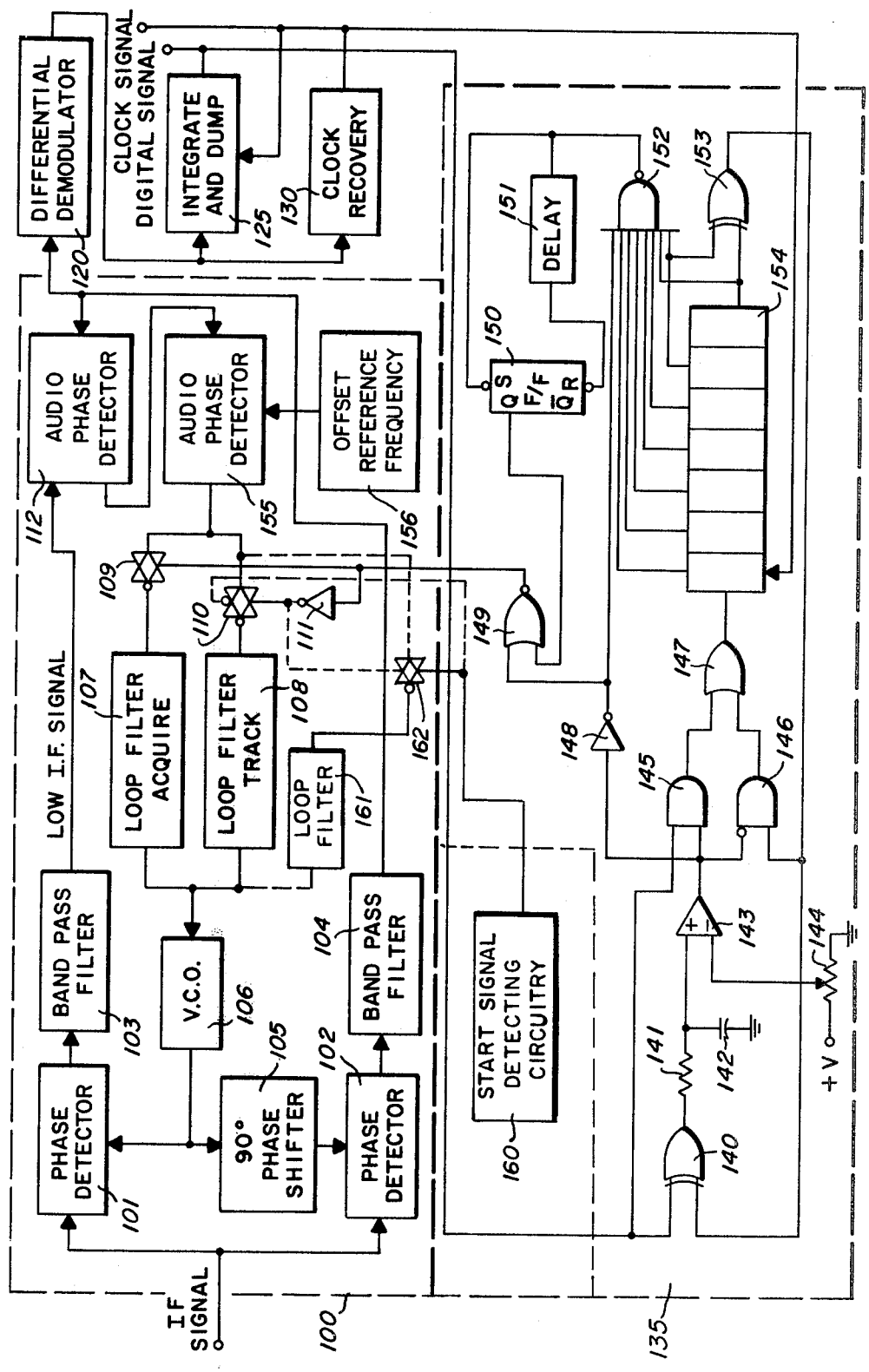

DIGITAL SIGNAL RECEIVER HAVING A DUAL BANDWIDTH TRACKING LOOP

TECHNICAL FIELD

The present invention relates to digital signal receivers, and more particularly to digital signal receivers having a dual bandwidth tracking loop.

BACKGROUND ART

Costas loops such as that described in U.S. Pat. No. 3,101,448 have typically been used as tracking loops in suppressed carrier data demodulation systems. However, tracking loops such as the Costas loop do not provide fast initial carrier acquisition since narrow loop bandwidths are used in such systems to maintain lock and minimize phase jitter in noisy environments. This problem may be alleviated to some degree by utilizing dual bandwidth tracking loops where a relatively wide bandwidth is used for fast initial carrier acquisition and a relatively narrow bandwidth is utilized once the tracking loop has adequately locked to the carrier. Tradeoffs in the design of such dual bandwidth tracking loops are discussed in the book "Synchronization Systems In Communication and Control", by William C. Lindsey and published by Prentice Hall, 1972, in Chapter 5. However, in order to practically utilize a dual bandwidth tracking loop, a loop-lock detector must be utilized to control the bandwidth switching. A loop-lock detector that is suitable for use with a Costas loop is described in the book "Spread Spectrum Systems", by Dixson and published by Prentice Hall, 1972, in Chapter 5 at pages 156-158. The loop-lock detector presented by Dixson utilizes three multipliers and two low pass filters. However, the loop lock indicator does not insure relatively fast acquisition times for large frequency offsets when receiving weak carrier signals.

SUMMARY OF THE INVENTION

It is an object of the present invention to provide an improved digital signal receiver having a dual bandwidth tracking loop providing relatively fast initial carrier acquisition.

It is another object of the present invention to provide an improved digital signal receiver having a dual bandwidth tracking loop where bandwidth switching is provided prior to achieving absolute lock to the carrier in the tracking loop.

It is a further object of the present invention to provide a digital signal receiver having a multi-bandwidth tracking loop where bandwidth switching is initiated upon detection of a predetermined start signal preceding a message signal.

Briefly described, the invention encompasses a receiver for a digital signal that is modulated on the carrier signal. The digital signal is transmitted in a serial bit stream at a predetermined bit frequency by a clock signal and may be modulated according to phase shift keying (PSK) or differential PSK. The digital signal further includes at least one predetermined start signal followed by a message signal. The start signal may have a predetermined number of bits organized in a predetermined bit pattern, such as, a predetermined pseudorandom bit pattern. Furthermore, one or more unique start signals may be provided prior to the message signal. The message signal may communicate, for example, various commands, status or data for use by other circuitry in the receiver.

The digital signal receiver further includes a tracking phase-locked loop, such as a Costas loop, for demodulating the coded digital signal from the carrier signal, and circuitry for demodulating the digital signal and recovering a clock signal from the demodulated digital signal. Start-code detecting circuitry is responsive to the demodulated digital signal and the recovered clock signal for providing an indication signal when the start signal has been detected. Loop filter circuitry disposed in series with the tracking loop provides a bandwidth switchable from a predetermined acquire bandwidth to a predetermined tracking bandwidth when enabled. The acquire bandwidth provides a relatively large bandwidth facilitating fast signal acquisition, while the tracking bandwidth, being narrower than the acquire bandwidth, provides a relatively narrow bandwidth for completing carrier lock on and reliably tracking relatively weak carrier signals in an noisy environment. Analog switching circuitry is coupled to the loop filter circuitry for enabling the loop filter circuitry to switch from the acquire bandwidth to the tracking bandwidth in response to the indication signal from the start-signal detecting circuitry. Thus, the loop bandwidth is switched from the acquire bandwidth to the tracking bandwidth when the start signal is detected. Furthermore, the bandwidth switching may occur before absolute carrier lock on has been achieved in the tracking loop. Since the loop with the tracking bandwidth may complete carrier lock on, the narrow-band tracking mode of the tracking loop is achieved before the loop is locked, whereas prior art circuits utilizing loop-lock detectors must achieve absolute loop-lock before switching bandwidths.

BRIEF DESCRIPTION OF THE DRAWING

The drawing illustrates a functional block diagram of a digital signal detector embodying the present invention.

DETAILED DESCRIPTION OF THE INVENTION

Referring to the drawing, an embodiment of the digital signal detector of the present invention is illustrated that includes a tracking phase-locked loop 100, a differential demodulator circuitry 120, integrate and dump circuitry 125, clock recovery circuitry 130 and start-signal detecting circuitry 135. The tracking loop 100 may be any suitable loop, such as that described in U.S. Pat. Nos. 3,101,448 and 3,768,030. For the preferred embodiment, there is illustrated an offset Costas loop, which mixes down to a low intermediate frequency rather than baseband frequencies in order to recover differential PSK Data signals. For proper operation of the differential demodulator 120, the low intermediate frequency is an integer multiple of half the data rate and is provided by the action of the audio phase detector 155 and offset reference 156. The IF signal, applied to the tracking loop 100, may be provided by any suitable IF circuitry for receiving the carrier signal.

The differential demodulator 120, the integrate and dump circuitry 125 and clock recovery circuitry 120 may be any suitable conventional circuitry, such as that described in the Motorola manual entitled, "MODAT Metropolitan Mobile Data Terminal", No. 68P81028E45, published by Motorola Service Publications, 1975. The differential demodulator 120 receives the differential PSK bit stream at the low intermediate frequency and provides a non-return to zero bit stream to the integrate and dump circuitry 125 and clock recovery circuitry 130. The integrate and dump circuitry 125 provides for noise filtering and clock re-synchronization of the bit stream. The clock recovery circuitry 130, which may be provided by a digital phase-locked loop, utilizes bit transitions to recover the clock signal. All of the foregoing circuits are described in detail in the aforementioned instruction manual.

The start-signal detecting circuitry 135 not only provides for detection of the start signal, but also provides a synchronization pulse (output of NAND gate 152) for other circuitry of the receiver that utilize the message signal. The detecting circuitry 135 constantly scans the recovered digital signal for the presence of the start signal. The start signal may be any suitable pseudorandom bit pattern, such as those described in U.S. Pat. Nos. 3,906,445 and 3,586,776 or in U.S. patent application Ser. No. 830,951, entitled "Method and Apparatus for the Synchronization of Data Bit Stream", by John En, filed on Sept. 6, 1977 and assigned to the instant assignee. For example, a start code may be one of the 32-bit patterns described in the foregoing patent application or the 127 bit patterns described in the foregoing patents. The preferred embodiment uses a 127 bit pseudorandom pattern similar to that described in the U.S. Pat. No. 3,906,445. Moreover, multiple start signals may also be utilized in practicing the present invention. For example, a first start signal (which may be detected by start signal detecting circuitry 135 for controlling the loop bandwidth by means of circuitry 107-111); may be followed by a second start signal (which may be detected by start signal detecting circuitry 160 for controlling the loop bandwidth by means of circuitry 161 and 162) that has a bit pattern different from the first. Different bandwidths may be selected by detection of each of the first and second start signals. Moreover, additional start signals could also be utilized for providing multi-bandwidth switching.

Referring to the drawing, the digital signal is coupled to EXCLUSIVE OR gate 140 which compares the bits of the digital signal to internally generated bits which are provided by a bit pattern generator similar to that used at the transmitter. The detecting circuitry 135 continually attempts to form the same bit pattern as the one received in the digital signal. When initially scanning for the start signal, the digital signal is applied via AND gate 145 and NOR gate 147 to shift register 154. The shift register 154 together with EXCLUSIVE OR gate 153 comprise a bit sequence generator. Thus, the output of EXCLUSIVE OR gate 153 produces the next expected bit of the bit pattern. The output of EXCLUSIVE OR gate 153 is then compared to the bits of the digital signal by EXCLUSIVE OR gate 140. If the output of EXCLUSIVE OR gate 153 and the next bit of the digital signal have the same logical state, a logic low is provided at the output of EXCLUSIVE OR gate 140. The output of EXCLUSIVE OR gate 140 is applied via resistor 141 to capacitor 142. Thus, capacitor 142 is discharged toward zero volts by a logic low output from EXCLUSIVE OR gate 140. When approximately twenty-five bits from the digital signal are found to be the same as the output from EXCLUSIVE OR gate 153, the voltage at the output of amplifier 143 will be less than 1.5 volts, or a logic low state. The logic low from amplifier 143 causes AND gate 145 to be disabled and AND gate 146 to be enabled. The bits now applied to shift register 154 will be the output of EXCLUSIVE OR gate 153, or the internally generated bit pattern, instead of the bits of the digital signal. The output of amplifier 143 will remain in a logic low state providing the incoming bits continue to match the internally generated pattern from EXCLUSIVE OR gate 153. If a mismatch of more than twenty bits occurs, amplifier 143 will provide a logic high state and the foregoing operation will be repeated.

The integration time constant of resistor 141 and capacitor 142 and the threshold voltage provided by potentiometer 144 can both be varied to achieve a particular desired noise falsing and sensitivity in the integrator 141-144. Furthermore, the integrator 141-144 can be implemented by utilizing entirely digital circuitry. For example, the integrator may be realized by utilizing an up/down counter which counts up or down depending on the logical state of the output of EXCLUSIVE OR gate 140. Then, when the totallized count in the counter goes below a threshold count, the register 154 is enabled to receive the internally generated bit pattern.

NAND gate 152 is enabled to provide a logic low output when the last bit of the start signal is shifted into shift register 154. For the preferred embodiment, the last 7 bits of the start signal each have a logic high state. NAND gate 152 provides a logic low pulse which activates delay circuit 151. When activated, delay circuit 151 provides a logic high pulse which has a predetermined time interval that is greater than the duration of the message signal. The logic low pulse from NAND gate 152 is also applied to the set input of flip-flop 150, causing the Q output to change from a logic low state to a logic high state. At the end of the pulse output from delay circuit 151, the reset input of flip-flop 150 is activated which causes the Q output of flip-flop 150 to change from a logic high state to a logic low state again.

The outputs from inverter 148 and flip-flop 150 are combined by NOR gate 149 for enabling the tracking loop 100 to switch from the acquire mode to the track mode when either inverter 149 or flip-flop 150 provides a logic high output signal. Thus, NOR gate 149 provides a logic low output signal when integrator 141-144 detects at least twenty-five bits of the start signal. Next, flip-flop 150 is set (Q=1) when the last bit of the incoming start signal is shifted into shift register 154. The tracking loop 100 is maintained in the tracking mode by NOR gate 149 until delay circuit 151 times out, regardless of whether inverter 148 has changed back to a logic low state.

The output from NOR gate 149 is coupled to transmission gate 109 and via an inverting gate 111 to transmission gate 110. The tracking mode is provided when transmission gate 110 is enabled to couple tracking loop filter 108 to VCO 106. Conversely, transmission gate 109 is enabled to couple acquire loop filter 107 to VCO 106 in the acquire mode. The tracking loop filter 108 is designed to provide a narrow bandwidth for tracking weak carrier signals in a noisy environment. The acquire loop filter 107 is designed to provide the wide bandwidth for allowing fast initial carrier acquisition. Both the acquire and tracking loop filters 107 and 108 may be designed by utilizing conventional techniques known in the art. The transmission gates 109 and 110 may be the Motorola MC14016 CMOS integrated circuits. Similarly, the logic circuits of the detecting circuitry 135 may be realized with conventional integrated circuits, such as those described in the "Semiconductor Data Library/CMOS", Volume 5, published by Motorola Semiconductor Products Inc., 1976.

I claim:

1. A receiver for a digital signal modulated on a carrier signal, the digital signal transmitted in a serial bit stream at a predetermined bit frequency by a clock signal, the digital signal including a predetermined start signal followed by a message signal, said receiver including tracking phase-locked loop means for recovering the digital signal from the carrier signal, and digital demodulating means for demodulating the digital signal and recovering the clock signal from the demodulated digital signal, said receiver further comprising:
   (a) means responsive to the demodulated digital signal and recovered clock signal for detecting the start signal and providing an indication signal when the start signal has been detected;
   (b) said tracking phase-locked loop means further including:
      (i) loop filter means disposed in series with the tracking loop for providing a bandwidth switchable from a predetermined acquire bandwidth to a predetermined tracking bandwidth when enabled, the predetermined tracking bandwidth being narrower than the predetermined acquire bandwidth; and
      (ii) analog switching means coupled to the loop filter means for enabling the loop filter means to switch from the predetermined acquire bandwidth to the predetermined tracking bandwidth in response to the indication signal from the start-signal detecting means.

2. The digital signal receiver according to claim 1, wherein the start-signal detecting means provides a predetermined first state of the indication signal prior to detecting the start signal and a predetermined second state of the indication signal after detecting the start signal; said loop filter means includes first and second loop filters, the first loop filter providing the predetermined acquire bandwidth when enabled, and the second loop filter providing the predetermined tracking bandwidth when enabled; and said analog switching means including means for enabling the first loop filter in response to the predetermined first state of the indication signal and enabling the second loop filter in response to the predetermined second state of the indication signal.

3. The digital signal receiver according to claim 2, wherein the tracking phase-locked loop means includes an offset Costas loop.

4. The digital signal receiver according to claim 2, wherein said detecting means further includes means for providing the predetermined second state of the indication signal for a predetermined time interval that is greater than the time duration of the message signal.

5. The digital signal receiver according to claim 1, wherein the digital signal is modulated on the carrier signal according to phase-shift keying.

6. The digital signal receiver according to claim 1, wherein the digital signal is modulated on the carrier signal according to differential phase-shift keying.

7. A receiver for digital signals modulated on a carrier signal, the digital signal transmitted in a serial bit stream at a predetermined bit frequency by a clock signal, the digital signal including a predetermined first start signal, a predetermined second start signal following the first start signal and a message signal following the second start signal, said receiver including tracking phase-locked loop means for recovering the digital signal from the carrier signal and digital demodulator means for demodulating the digital signal and recovering the clock signal from the demodulated digital signal, said receiver further comprising:
   (a) first means responsive to the demodulated digital signal and recovered clock signal for detecting the first start signal and providing a first indication signal having a predetermined first state prior to detecting the first start signal and the predetermined second state after detecting the first start signal;
   (b) second means responsive to the demodulated digital signal and recovered clock signal for detecting the second start signal and providing a second indication signal having a predetermined first state prior to detecting the second start signal and a predetermined second state after detecting the second start signal; and
   (c) said tracking phase-locked loop means further including:
      (i) first loop filter means disposed in series with the tracking loop for providing when enabled a predetermined acquire bandwidth;
      (ii) second loop filter means disposed in series with the tracking loop for providing when enabled a predetermined intermediate bandwidth that is narrower than the predetermined acquire bandwidth;
      (iii) third loop filter means disposed in series with the tracking loop for providing when enabled a predetermined tracking bandwidth that is narrower than the predetermined intermediate bandwidth;
      (iv) first analog switch means coupled to the first loop filter means for enabling the first loop filter means in response to the predetermined first state of the first indication signal;
      (v) second analog switch means coupled to the second loop filter means for enabling the second loop filter means in response to the predetermined second state of the first indication signal and the predetermined first state of the second indication signal; and
      (vi) third analog switch means coupled to the third loop filter means for enabling the third loop filter means in response to the predetermined second state of the first indication signal and the predetermined second state of the second indication signal.

8. The digital signal receiver according to claim 7, wherein the tracking phase-locked loop means includes an offset Costas loop.

9. The digital signal receiver according to claim 7, wherein said first detecting means further includes means for providing the predetermined second state of the first indication signal for a first predetermined time interval after detecting the first start signal, the second start signal and the message signal having a combined time duration less than the first predetermined time interval; and said second detecting means further includes means for providing the predetermined second state of the second indication signal for a second predetermined time interval after detecting the second start signal, the message signal having a time duration less than the second predetermined time interval.

10. A receiver for a digital signal modulated on a carrier signal, the digital signal transmitted in a serial bit stream at a predetermined bit frequency by a clock signal, said receiver including a Costas tracking loop for recovering the digital signal from the carrier signal, and a digital demodulator for demodulating the digital signal and recovering the clock signal from the demodulated digital signal, the digital signal including a predetermined start signal followed by a message signal, the start signal having a predetermined number of bits organized in a predetermined bit pattern, said receiver further comprising:

(a) means for detecting the start signal including:
  (i) register means having a plurality of stages, the register means responsive to the demodulated digital signal and recovered clock signal for serially receiving the demodulated digital signal, the register means having at least as many stages as the predetermined number of bits of the start signal; and
  (ii) gating means coupled to the stages of the shift register for decoding the predetermined bit pattern of the start signal and providing a start pulse signal when the start signal is decoded;
(b) means responsive to the start pulse signal for providing a message window signal having a predetermined time interval that is greater than the time duration of the message signal; and
(c) said Costas tracking loop further including:
  (i) loop filter means disposed in series with the tracking loop for providing a bandwidth switchable from a predetermined acquire bandwidth to a predetermined tracking bandwidth when enabled, the predetermined tracking bandwidth being narrower than the predetermined acquire bandwidth; and
  (ii) analog switching means coupled to the loop filter means for enabling the loop filter means to switch from the predetermined acquire bandwidth to the predetermined tracking bandwidth in response to the message window signal.

11. In a receiver for a digital signal modulated on a carrier signal, the digital signal transmitted in a serial bit stream at a predetermined bit frequency by a clock signal, the digital signal including at least one predetermined start signal followed by a message signal, the start signal having a predetermined number of bits organized in a predetermined bit pattern, said receiver including tracking phase-locked loop means for recovering the digital signal from the carrier signal, and digital demodulating means for demodulating the digital signal and recovering the clock signal from the demodulated digital signal, a method for controlling the bandwidth of the tracking loop means, said method comprising the steps of:

detecting at least a minimum number of bits of the start signal and providing an indication signal when the minimum number of bits have been detected; and switching the bandwidth of the tracking loop from an acquire bandwidth to a narrower tracking bandwidth in response to the indication signal.

* * * * *